(12) United States Patent
Jung (10) Patent No.: US 6,992,905 B2
(45) Date of Patent: Jan. 31, 2006

(54) HIGH VOLTAGE GENERATOR HAVING SEPARATE VOLTAGE SUPPLY CIRCUIT

(75) Inventor: Won-chang Jung, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 10/885,796

(22) Filed: Jul. 8, 2004

(65) Prior Publication Data
US 2005/0099830 A1    May 12, 2005

(30) Foreign Application Priority Data
Nov. 7, 2003    (KR) ........................ 10-2003-0078641

(51) Int. Cl.
    *H02M 3/18*    (2006.01)
(52) U.S. Cl. ........................................ 363/60; 327/536

(58) Field of Classification Search ................ 363/59, 363/60; 327/536
See application file for complete search history.

(56) References Cited

U.S. PATENT DOCUMENTS 5,677,645 A * 10/1997 Merritt ..................... 327/536

* cited by examiner

*Primary Examiner*—Shawn Riley
(74) *Attorney, Agent, or Firm*—Volentine Francos & Whitt, PLLC

(57) ABSTRACT

A high voltage generation circuit comprises a first boosting unit, a second boosting unit, a delay circuit which delays the output of the first boosting unit as applied the second boosting unit, a pre-charge unit, and switch units which connect respective nodes in response to control signals. A voltage supply circuit is also provided that converts an externally supplied power source voltage (VCC) to a predetermined pre-charge voltage (VPP2).

15 Claims, 10 Drawing Sheets

FIG. 1A

< FIRST PUMPING >

FIG. 1B

< SECOND PUMPING >

FIG. 1C

< THIRD PUMPING >

HIGH VOLTAGE GENERATOR HAVING SEPARATE VOLTAGE SUPPLY CIRCUIT

BACKGROUND OF THE INVENTION

1. Field of the Invention

The present invention relates generally to a semiconductor device, and more particularly, to a semiconductor device having a high voltage generator with a short pumping operation time and improved efficiency in current usage. A claim of priority is made to Korean Patent Application No. 03-78641 filed on Nov. 7, 2003 in the Korean Intellectual Property Office, the disclosure of which is hereby incorporated by reference in its entirety.

2. Description of the Related Art

It is quite common for a semiconductor device to use a relatively higher voltage to drive some circuits as compared with other circuits internal to the device. For example, a semiconductor memory device will often use a voltage to drive word lines that is higher than a normally provided external voltage. The term "external" generally refers to a voltage provided by a circuit outside the semiconductor device itself, as compared with "internal" voltages which are generated by circuits within the semiconductor device. Thus, where a relatively higher voltage is required, the semiconductor device typically includes a high voltage generation circuit that converts the external voltage supplied to the semiconductor device into a signal suitable for use by high voltage circuits and components. In conventional semiconductor devices, a pumping circuit is generally used as a high voltage generation circuit.

In situations where a host system runs off of ordinary batteries, similarly constructed, high voltage generation circuits are typically required to internally generate voltages exceeding the nominal output of the batteries.

Recent host system evolutions have consistently seen power source voltages decreased. As a result, the externally provided power source voltages applied to semiconductor memory devices within the host systems has also been decreasing. While some accommodation to lower externally supplied voltages has been made within the design of semiconductor memory devices, the amount by which the internally required high voltages can be reduced is proportionally much less than the amount by which the external power source voltage has been reduced. Accordingly, it is increasingly difficult to generate the required high voltages with semiconductor memory devices using conventional high voltage generators.

In addition to the problem of unmet overall demand for high voltages, the relative pumping efficiency of high voltage generators is also becoming a problem. That is, as externally supplied voltages have decreases, the pumping efficiency of conventional circuits generating high voltages has markedly dropped.

Further problems arise from the decrease in externally supplied voltages. Fir example, conventional high voltage generation circuits typically require the use of one or more pumping circuits that use capacitors. When the externally supplied voltage is significantly lower than a desired high voltage, it is not uncommon to see three or more boosting stages used to develop the high voltage. Unfortunately, the time required to fully pre-charge the capacitors in each of these boosting stages increases proportionally, and as a result, the time for one operation increases to the point where the entire boosting timing becomes unacceptably long.

SUMMARY OF THE INVENTION

The present invention provides a high voltage generation circuit which efficiently generates a high voltage output for subsequent used within a semiconductor memory device.

The present invention further provides a high voltage generation circuit having a reduced pre-charge time for boosting units used to develop the high voltage output.

Accordingly, in one aspect, the present invention provides a high voltage generation circuit generating a high voltage output (VPP). The circuit comprises a first node receiving an driving signal defined by a power source voltage (VCC), a first boosting unit connected between the first node and a second node, wherein the first boosting unit changes the electrical potential of the first node in response to the driving signal, and pre-charges the second node with a pre-charge voltage (VPP2) in response to a pre-charge signal, a second boosting unit connected between a third node and a fourth node, wherein the second boosting unit changes the electrical potential of the third node in response to the driving signal, and pre-charges the fourth node with the pre-charge voltage (VPP2) in response to the pre-charge signal, a delay circuit connected between first and third nodes and delaying an output from the first boosting unit to the second boosting unit, a pre-charge circuit pre-charging the second and fourth nodes with the pre-charge voltage (VPP2) in response to the pre-charge signal, a first switch response to a transfer signal connecting the second and fourth nodes, and a second switch response to a transmission signal outputting the high voltage output (VPP) from the fourth node.

In another aspect, the present invention provides a high voltage generation circuit generating a high voltage output (VPP) comprising; a pre-charge voltage supply circuit generating a pre-charge voltage (VPP2) in response to an externally provided power source voltage (VCC), a first node receiving the pre-charge voltage (VPP2), a first pumping capacitor connected between the first node and a second node, wherein the first pumping capacitor changes the electrical potential of the first node and pre-charges the second node in response to the pre-charge voltage (VPP2), a second pumping capacitor connected between a third node and a fourth node, wherein the second pumping capacitor changes the electrical potential of the third node and pre-charges the fourth node in response to the pre-charge voltage (VPP2), a delay circuit connected between first and third nodes and delaying an output from the first pumping capacitor to the second pumping capacitor, a pre-charge circuit pre-charging the second and fourth nodes with the pre-charge voltage (VPP2) in response to a pre-charge signal, a first switch response to a transfer signal connecting the second and fourth nodes, and a second switch response to a transmission signal outputting the high voltage output from the fourth node.

In yet another aspect, the present invention provides a high voltage generation circuit generating a high voltage output (VPP), comprising; a level converter receiving a power source voltage varying between a VCC voltage level and a ground voltage level, and generating a driving signal having an upper voltage level of VPP2, where VPP2 is higher than VCC, and a lower voltage level of VBB, where VBB is lower than ground voltage, a first node receiving the drive signal, a first boosting unit connecting the first node and a second node, wherein the first boosting unit drives the electrical potential of the first node between VPP2 and VBB in response to driving signal, and pre-charging the second node to VPP2, a second boosting unit connected between a third node and a fourth node, wherein the second boosting unit drives the electric potential of the third node in response to the driving signal, and pre-charges the fourth node to VPP2, a delay circuit connected between first and third nodes and delaying an the output from the first boosting unit as applied to the second boosting unit, a pre-charge circuit pre-charging the second and fourth nodes to VPP2, a first switch, response to a transfer signal, connecting the second and fourth nodes, and a second switch, response to a transmission signal, outputting the high voltage output from the fourth node.

BRIEF DESCRIPTION OF THE DRAWINGS

The above objects and other advantages of the present invention will become more readily apparent upon a review of the description of certain presently preferred embodiments that follow. This description is made in reference to the attached drawings in which:

FIG. 2b is a timing diagram of the operation of the circuit shown in FIG. 2a;

FIG. 3b is a timing diagram of the operation of the high voltage generation circuit shown in FIG. 3a;

FIG. 4b is a timing diagram of the operation of the high voltage generation circuit shown in FIG. 4a;

FIG. 5b is a timing diagram of the operation of the high voltage generation circuit shown in FIG. 5a.

DESCRIPTION OF THE PREFERRED EMBODIMENTS

Figure 1A:
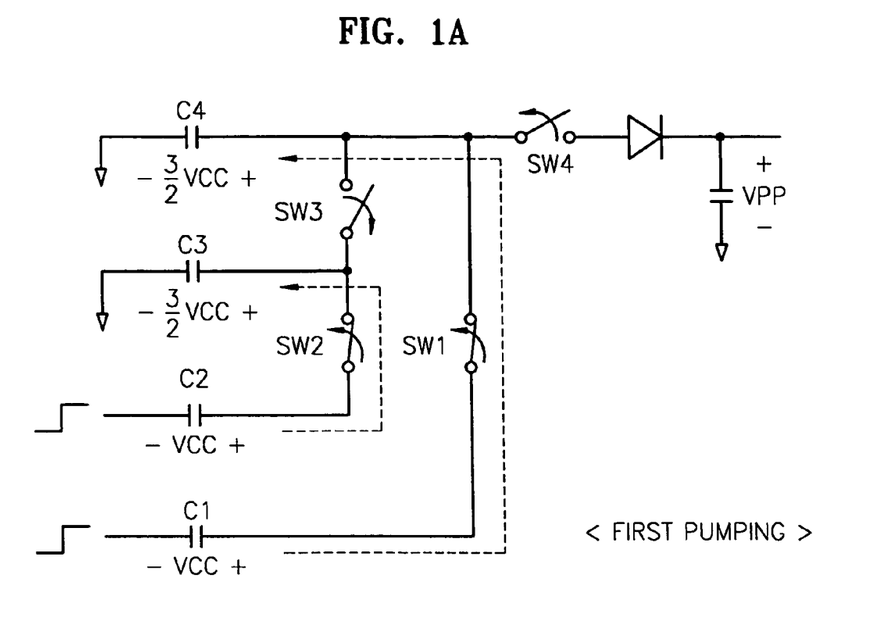
FIGS. 1a through 1c are diagrams showing the operation of a prior art triple pumping circuit.

Referring to FIG. 1a, four capacitors (C1 through C4) are pre-charged from an external power source voltage (VCC). Then, a first switch (SW1) and a second switch (SW2) are turned on, and by driving C1 and C2 with the power source voltage (VCC), a first pumping operation is performed. As a result, the electrical charge from C1 is provided to C4 and the charge from C2 is provided to C3. Accordingly, a voltage level is developed on C3 and C4 that is equal to VCC+0.5 VCC.

Figure 1B:
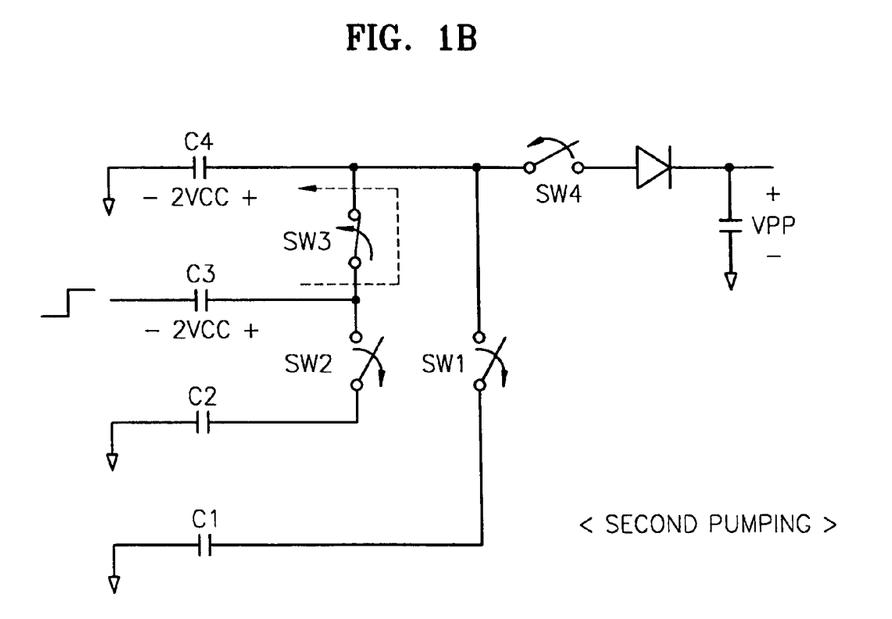

Referring now to FIG. 1b, first switch (SW1) and second switch (SW2) are turned off, and a third switch (SW3) is turned on. Thereafter, by driving C3 with the power source voltage (VCC), a second pumping operation is performed. As a result of this second pumping operation, C3 develops a voltage level equal to VCC+1.5 VCC, and thereafter the charge stored on C3 is provided to C4, such that a voltage equilibrium is maintained. Accordingly, a voltage of 2 VCC is developed on C3 and C4.

Figure 1C:
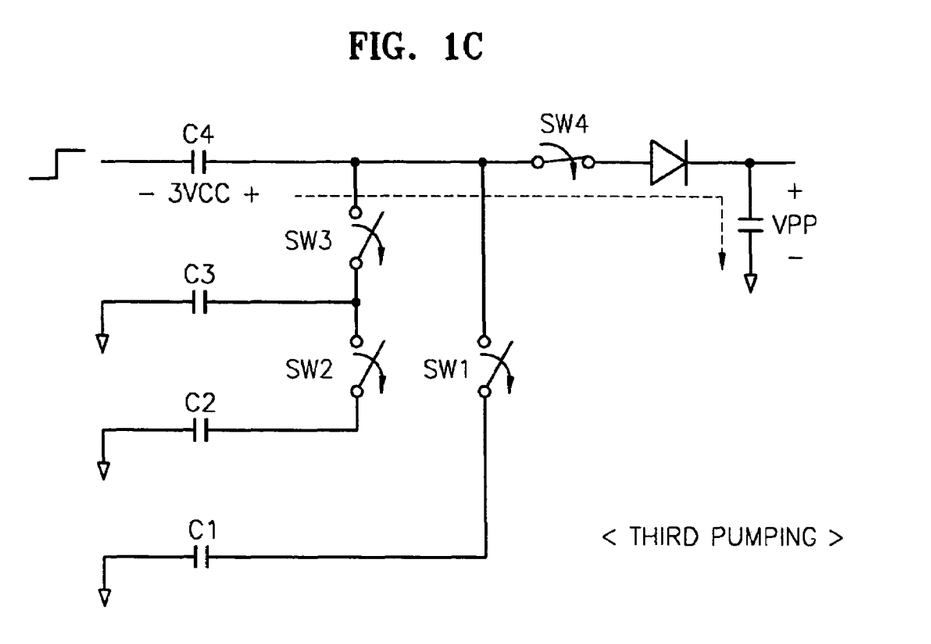

Referring now to FIG. 1c, a third pumping operation if performed in which C4 is driven with the power source voltage (VCC) until a voltage developed on C4 becomes equal to 3 VCC. Then, if the first through third switch (SW1 through SW3) are turned off and a fourth switch (SW4) is turned on, the voltage stored in C4 is discharged to an external load. In theory, the voltage developed on C4 in FIG. 1c should rise to 3 VCC, or an intended high voltage VPP. However, the voltage actually developed on C4 is closer to about 2.5 VCC.

Referring again to the triple pumping circuit shown in FIGS. 1a through 1c, in order to generate a high voltage on a one time basis, three separate pumping operations are required, thereby increasing the time required to accomplish the entire pumping operation. In addition, after the high voltage generator concludes each pumping operation, the pumping capacitors must be pre-charged from the external supply voltage. This requirement allows charge stored on C3 or C4 is be discharged to the external supply voltage and the efficiency of overall current usage is degraded accordingly.

For example, if we assume an external supply voltage (VCC) of 2V and a desired high voltage (VPP) of 4.5V, it takes three separate pumping operations to develop a VPP voltage of 4.5V. In addition, even when the voltage of the pumping driver is reduced to 0V during the pre-charge operation, the voltage of the VPP is 2.5V and therefore 0.5V is wasted.

Figure 2A:
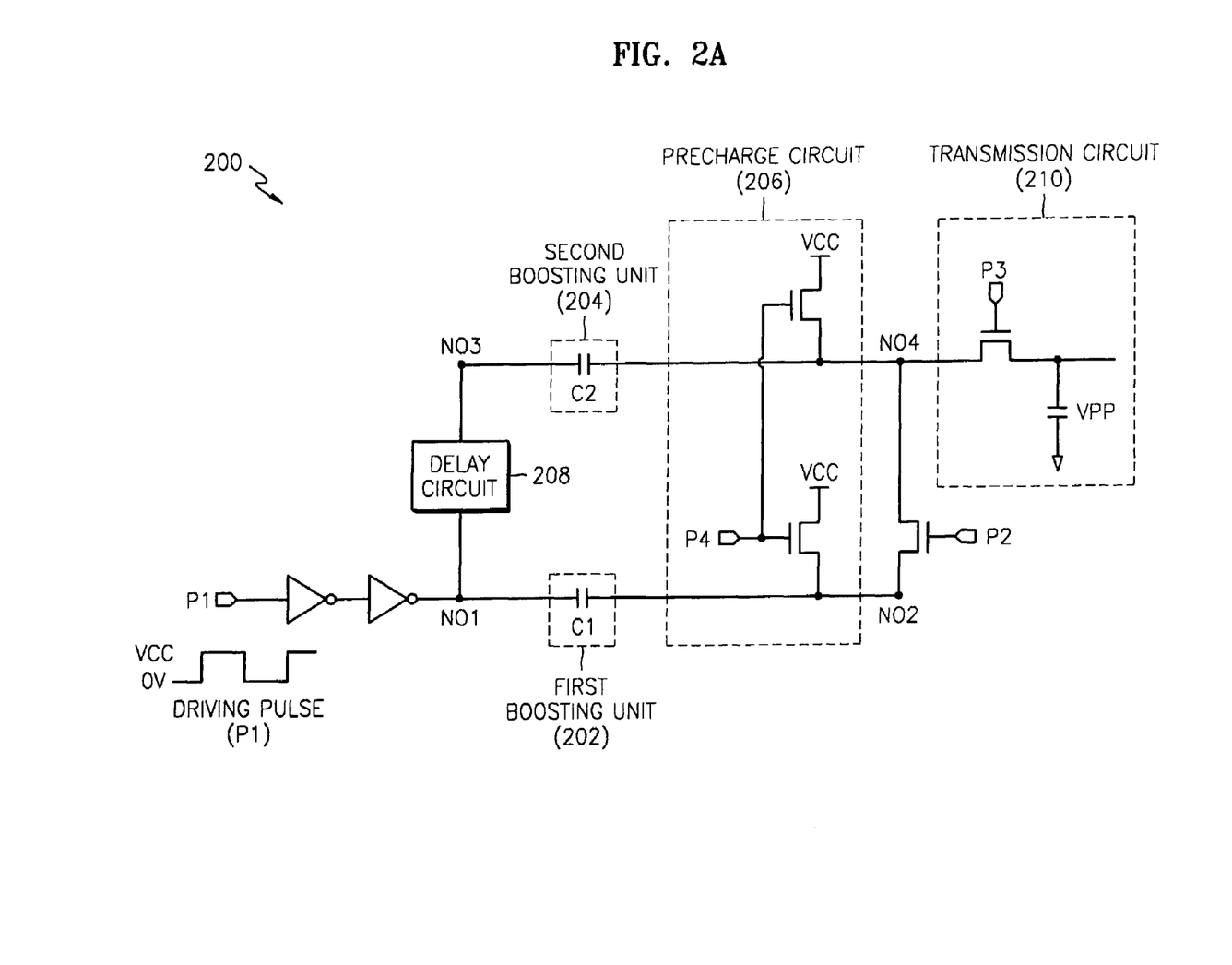
FIG. 2a is a diagram showing a pumping circuit using the external supply voltage (VCC) as the pre-charge voltage of a pumping capacitor.

FIG. 2a is a circuit diagram showing one embodiment of a pumping circuit that uses an external supply voltage (VCC) as a pre-charge voltage for one or more pumping capacitor(s).

Referring to FIG. 2a, a pumping circuit 200 according to one embodiment of the present invention comprises a first boosting unit 202, a second boosting unit 204, a pre-charge circuit 206, a delay circuit 208, and a transmission circuit 210.

A first pulse (P1), or driving signal, shown here as a square wave signal applied to a first node (NO1), swings between the power supply voltage (VCC) and ground. A second pulse (P2), or transfer signal, is used as a transfer pulse and is applied to pumping circuit 200 between a second node (NO2) and a fourth node (NO4). A third pulse (P3), or transmission signal, is used as a transfer pulse and is applied to between a fourth node (NO4) and an output terminal. A fourth pulse (P4), or pre-charge signal, is used a pre-charge pulse to pre-charge capacitors C1 and C2 in the first and second boosting units to the levels of second node (NO2) and fourth node (NO4), respectively, as raised to said levels by power source voltage (VCC).

A delay circuit 208 is disposed between the first boosting unit 202 and the second boosting unit 204 to transfer the voltage developed on C1 to C2. Pre-charge circuit 206 is connected to the second and fourth nodes (NO2 and NO4). Transmission circuit 210 transfers the voltage of the fourth node (NO4) to the outside.

Figure 2B:
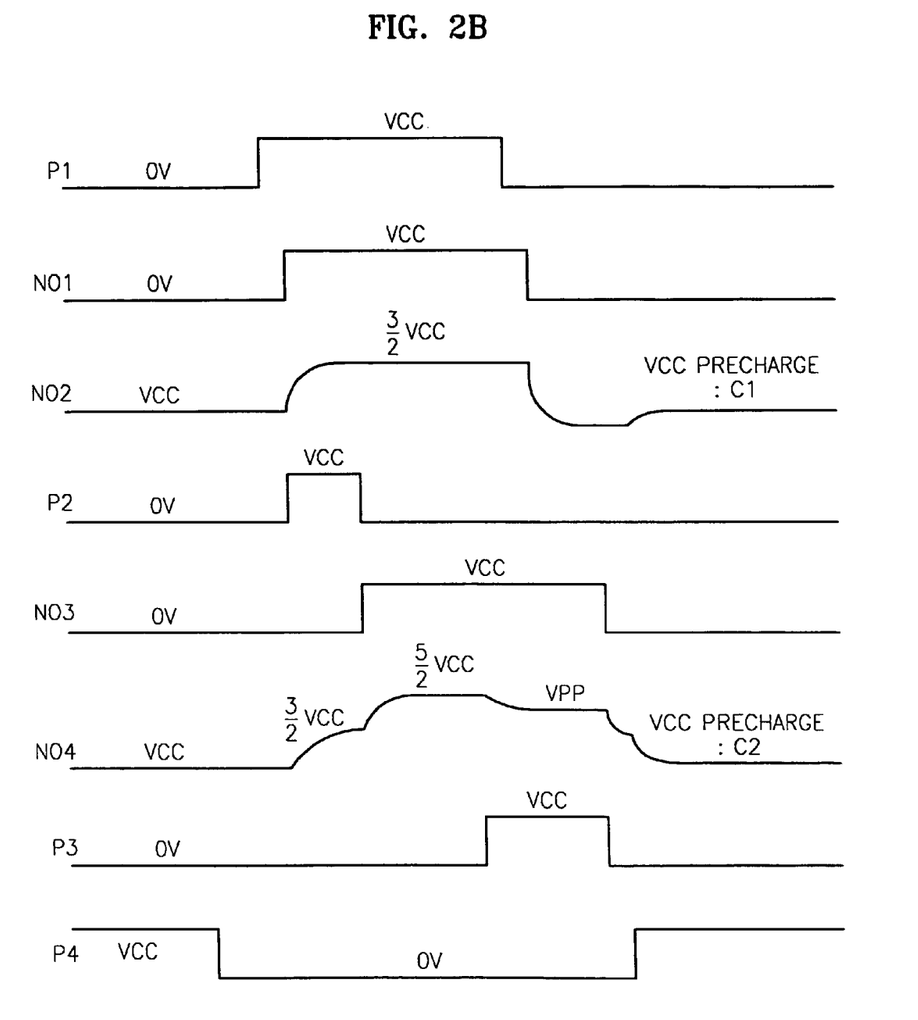

FIG. 2b is a timing diagram illustrating the operation of the pumping circuit shown in FIG. 2a.

Referring to FIGS. 2a and 2b, C1 and C2 are first pre-charged by power source voltage (VCC) when the fourth pulse (P4) is at a "high" logic level so that the voltage at second node (NO2) and fourth node (NO4) rise to VCC.

If the fourth pulse (P4) goes a "low" logic level and the first pulse (P1) and the second pulse (P2) go high, the voltage at the node (NO1) becomes VCC. Second node (NO2) is connected to fourth node (NO4), and the voltage at both of these nodes rises to become VCC+0.5 VCC.

When the first pulse (P1) is subsequently transferred to third node (NO3) through delay circuit 208, second pulse (P2) goes low. At this time, second and fourth nodes are disconnected from each other and the voltage at third node (NO3) becomes VCC. Accordingly, the voltage at fourth node (NO4) becomes 1.5 VCC+VCC. If the third pulse (P3)

goes high, the voltage at fourth node (NO4) becomes equal to VPP under the influence of an external capacitor and this voltage is provided through transmission circuit 210 to an external load or signal line.

If first pulse (P1) goes low, the voltage at first node (NO1) falls to 0V and respective voltages at the second through fourth nodes also fall to this level. Thereafter, fourth pulse (P4) goes high and pre-charges capacitors C1 and C2.

If the pumping circuit shown in FIG. 2a is used, a high voltage output is generated by twice pumping through delay circuit 208, thus reducing the time required to pre-charge capacitors C1 and C2, as compared with the conventional triple pumping scheme explained with reference to the circuit shown in FIG. 1. Accordingly, the time required for a single operation of the high voltage generator is greatly reduced, as compared with the conventional approach.

However, if through this operation, the double pumping scheme is performed by using an external power source voltage (VCC) as the pre-charge voltage for pumping capacitors C1 and C2, the maximum amount of electrical charge that can be stored by C1 and C2 is limited by VCC. In addition, when capacitor C1 is pre-charged, if the voltage at fourth node (NO4) is higher than VCC even though the voltage at third node (NO3) becomes 0V. That is, when the generated output voltage (VPP) is much higher than the pre-charge voltage (VCC), some portion of the charge stored on capacitor C2 is discharged to VCC. Thus, the amount of power wasted by the pumping circuit is unacceptable.

Figure 3A:
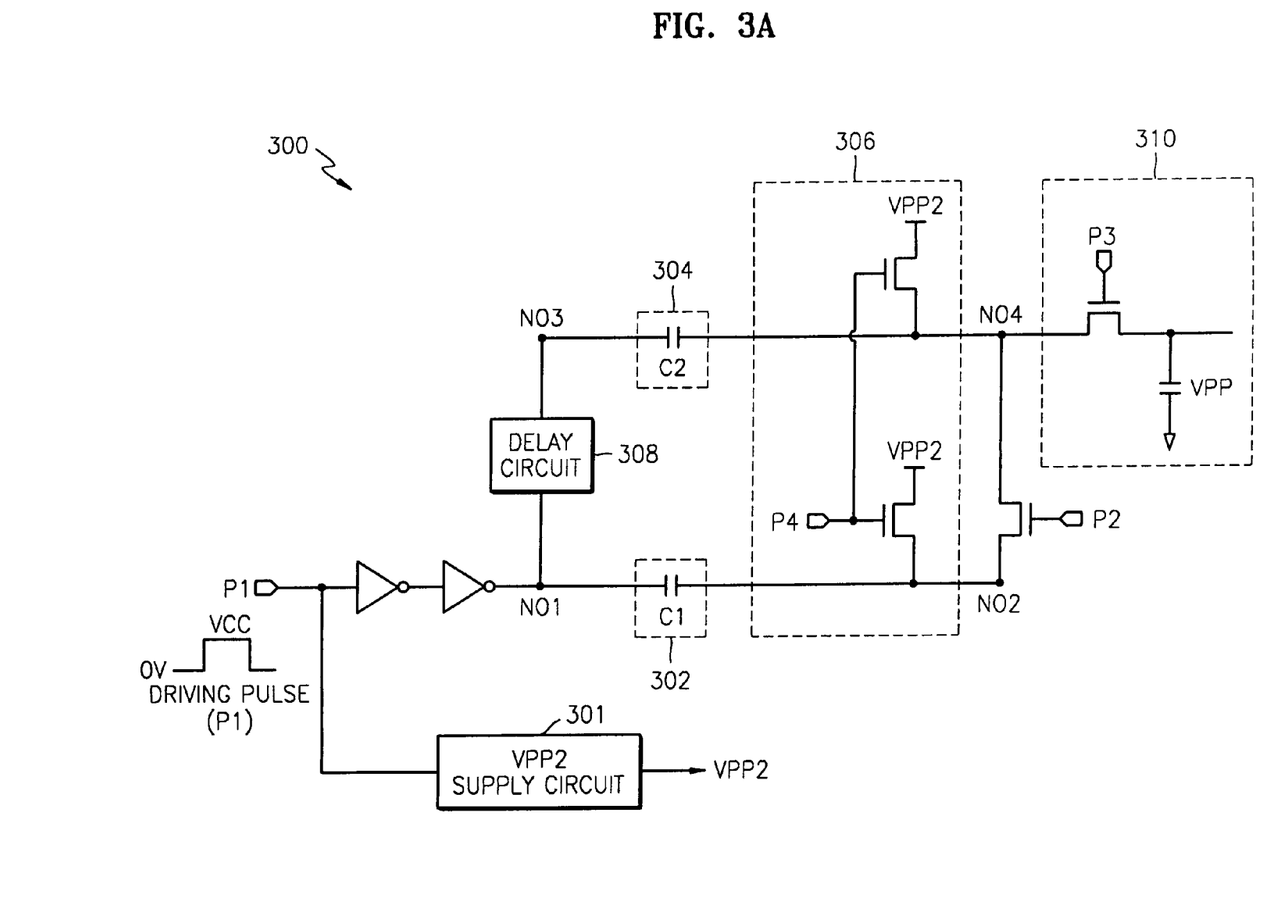
FIG. 3a is a diagram of a high voltage generation circuit according to a preferred embodiment of the present invention.

FIG. 3a is a diagram of a high voltage generation circuit according to a preferred embodiment of the present invention.

Referring to FIG. 3a, a high voltage generation circuit 300 according to another embodiment of the present invention comprises a VPP2 supply circuit 301, a first boosting unit 302, a second boosting unit 304, a pre-charge circuit 306, a delay circuit 308, and a transmission circuit 310. These circuit components are similar to their counterparts described above in relation to FIG. 2A. However, the pre-charge voltage provided to pre-charge circuit 306 is not equal to the power source voltage (VCC), but is equal to a pre-charge voltage VPP2 having a voltage value higher than that of power source voltage (VCC).

VPP2 supply circuit 301 may take the form of any circuit capable of providing a stable VPP2 voltage, which is used whenever high voltage generation circuit 300 is in operation.

Figure 3B:
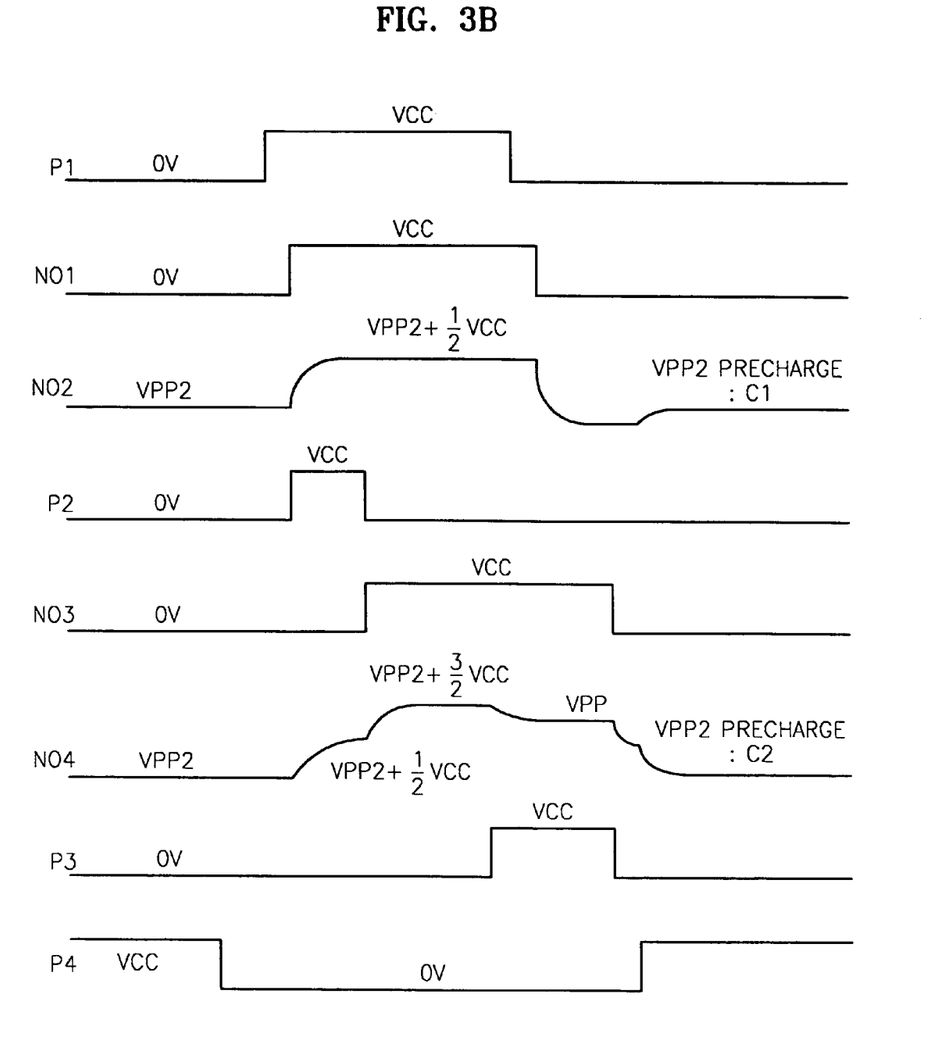

FIG. 3b is a timing diagram illustrating the operation of the high voltage generation circuit shown in FIG. 3a.

Referring to FIGS. 3a and 3b, when fourth pulse (P4) first goes high, second node (NO2) and fourth node (NO4) are pre-charged by pre-charge voltage (VPP2) provided by VPP2 supply circuit 301.

If the fourth pulse (P4) goes low and the first pulse (P1) and second pulse (P2) both go high, the voltage at first node (NO1) becomes VCC. The second node (NO2) is connected to fourth node (NO4) such that the voltages developed on second and fourth nodes becomes VPP2+0.5 VCC.

When first pulse (P1) is subsequently transferred through delay circuit 308 to third node (NO3), the second pulse (P2) goes low. At this time, second node and fourth node are disconnected from each other and the voltage at third node (NO3) becomes equal to VCC. Accordingly, the voltage at fourth node (NO4) becomes 1.5 VCC+VPP2. If the third pulse (P3) goes high, the voltage at fourth node (NO4) becomes VPP under the influence of an external capacitor and this voltage is provided through transmission circuit 310 to an external load or signal line.

The process by which the high voltage (VPP) is generated in the high voltage generation circuit of FIG. 3a is highly efficient when compared to the high voltage generation process in the high voltage generation circuit 200 of FIG. 2. Accordingly, with a shorter pumping timing, the high voltage (VPP) can be efficiently generated even with a reduced power source voltage (VCC) derived from a host system.

If the first pulse (P1) goes low, the voltage at first node (NO1) also becomes 0V and the voltage at the second through fourth nodes becomes VCC. Then, finally, the fourth pulse (P4) goes high, and pumping capacitors C1 and C2 are pre-charged with the pre-charge voltage VPP2.

The high voltage generation circuit shown in FIG. 3a does not need multiple pumping step operations such that the time required to generate a desired high voltage output can be further reduced. Also, since pumping capacitors C1 and C2 are pre-charged not just with power source voltage (VCC) but with pre-charge voltage VPP2, which is higher than the power source voltage, the amount of charge that can be stored in the pumping capacitors is increased. Thus, the high voltage output voltage (VPP) generated can be increased and the efficiency of the high voltage generator increases.

In addition, when the second pumping capacitor C2 is pre-charged, even though the voltage at third node (NO3) becomes 0V, the voltage at fourth node (NO4) becomes VPP2 and the amount of wasted electrical charge is greatly reduced.

Meanwhile, by forming VPP2 supply circuit 301 separately from high voltage generation circuit 300, the time needed to pump a high voltage generation circuit with pre-charge voltage VPP2, to pump again with VPP, and to pre-charge again can be significantly reduced, and the amount of wasted current can be reduced. In addition, by forming VPP2 supply circuit 301 separately from the high voltage generation circuit 300, the pre-charge voltage VPP2 that is needed whenever the high voltage generation circuit 300 performs a pumping operation can be stably provided.

Figure 4A:
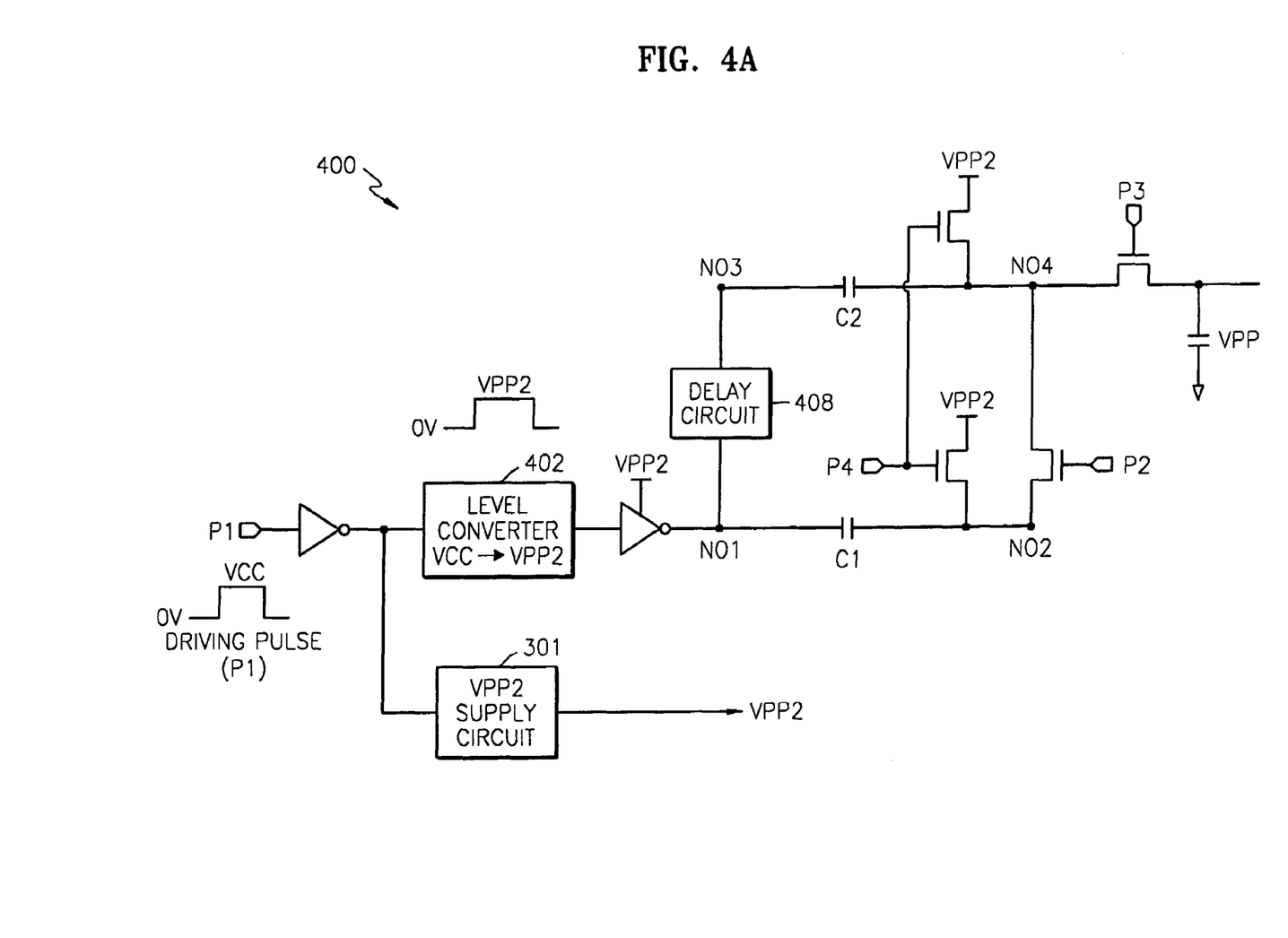
FIG. 4a is a diagram of a high voltage generation circuit according to another preferred embodiment of the present invention.

FIG. 4a is a diagram of a high voltage generation circuit according to yet another preferred embodiment of the present invention.

The high voltage generation circuit 400 shown in FIG. 4a is characterized, by way of comparison to FIG. 3a, in that it further comprises a level converter 402 for converting the power source voltage (VCC) to the pre-charge voltage VPP2.

The high voltage generation circuit 400 uses the pre-charge voltage (VPP2) to pre-charge pumping capacitors C1 and C2 through the level converter 402. In addition, VPP2 is used as a high power source of a driver driving the pumping capacitors C1 and C2. Also, in this case, in order to reduce VPP2 charge consumption in the high voltage generation circuit 400, VPP2 is only used in the driver end to drive the pumping operation of capacitors C1 and C2, and to achieve this level converter 402 converts VCC to VPP2.

Figure 4B:
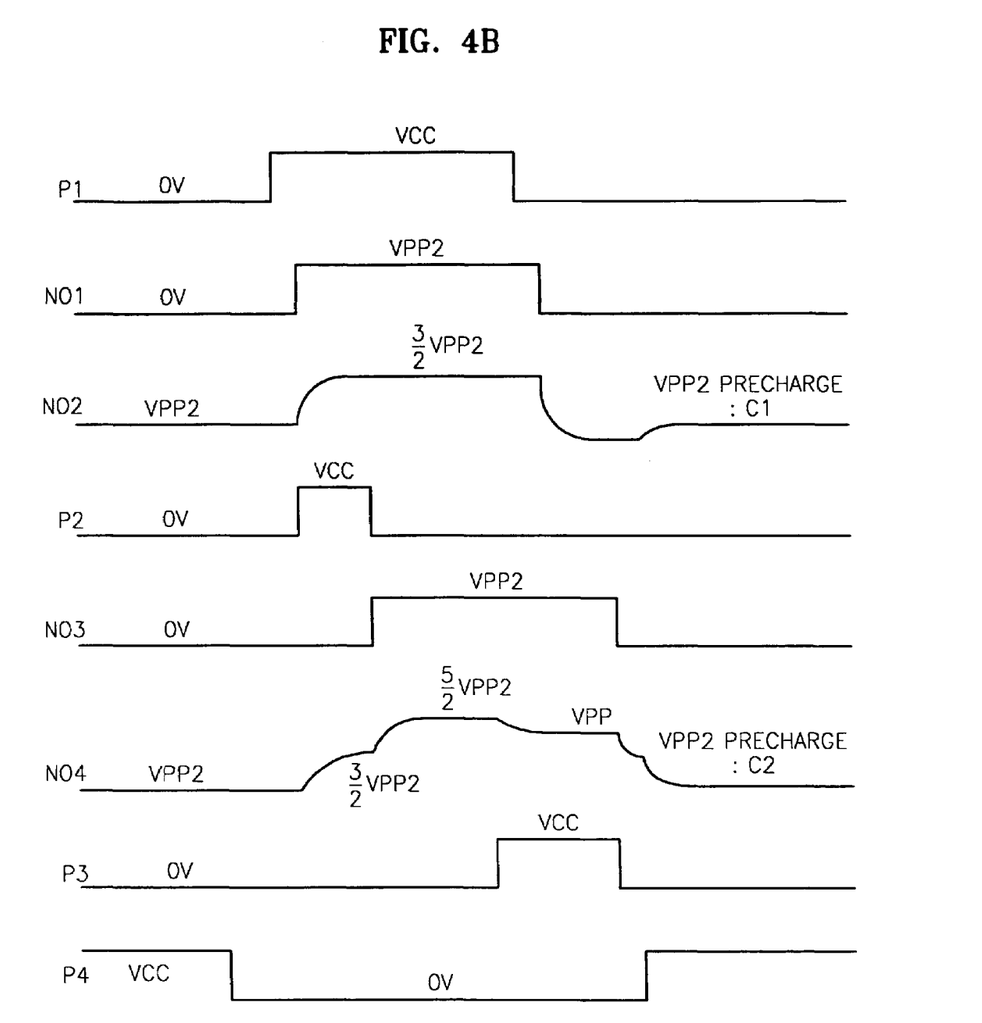

FIG. 4b is a timing diagram of the operation of the high voltage generation circuit shown in FIG. 4a.

Referring to FIGS. 4a and 4b, when fourth pulse (P4) first goes high, the voltages at second node (NO2) and fourth node (NO4) are pre-charged with the pre-charge voltage (VPP2) provided by VPP2 supply circuit 301.

If the fourth pulse (P4) then goes low and the first pulse (P1) and second pulse (P2) go high, the voltage at first node (NO1) becomes VPP2. The second node (NO2) is connected to the fourth node (NO4) and the voltage of the second node and fourth node becomes 1.5 VPP2.

When the first pulse (P1) is subsequently transferred through delay circuit 408 to third node (NO3), the second pulse (P2) goes low. At this time, the second node and fourth node are disconnected and third node (NO3) becomes VPP2. Accordingly, the voltage at fourth node (NO4) becomes 2.5 VPP2. If the third pulse (P3) goes high, fourth node (NO4) becomes VPP under the influence of an external capacitor and this voltage is provided through transmission circuit 210 (as shown in of FIG. 2) to an external load or signal line.

The high voltage output (VPP) which is generated at this time is a high efficiency voltage improved by 2.5 (VPP2-VCC) level over the high voltage generated in the high voltage generation circuit 200 of FIG. 2. Accordingly, with a shorter pumping time, the high voltage output (VPP) can be generated from a reduced power source voltage (VCC) supplied by a host system.

If the first pulse (P1) then goes low, first node (NO1) falls to 0V and the voltage at the second through fourth nodes falls by VCC. Then, finally, the fourth pulse (P4) goes high, and C1 and C2 are pre-charged with the pre-charge voltage VPP2.

Figure 5A:
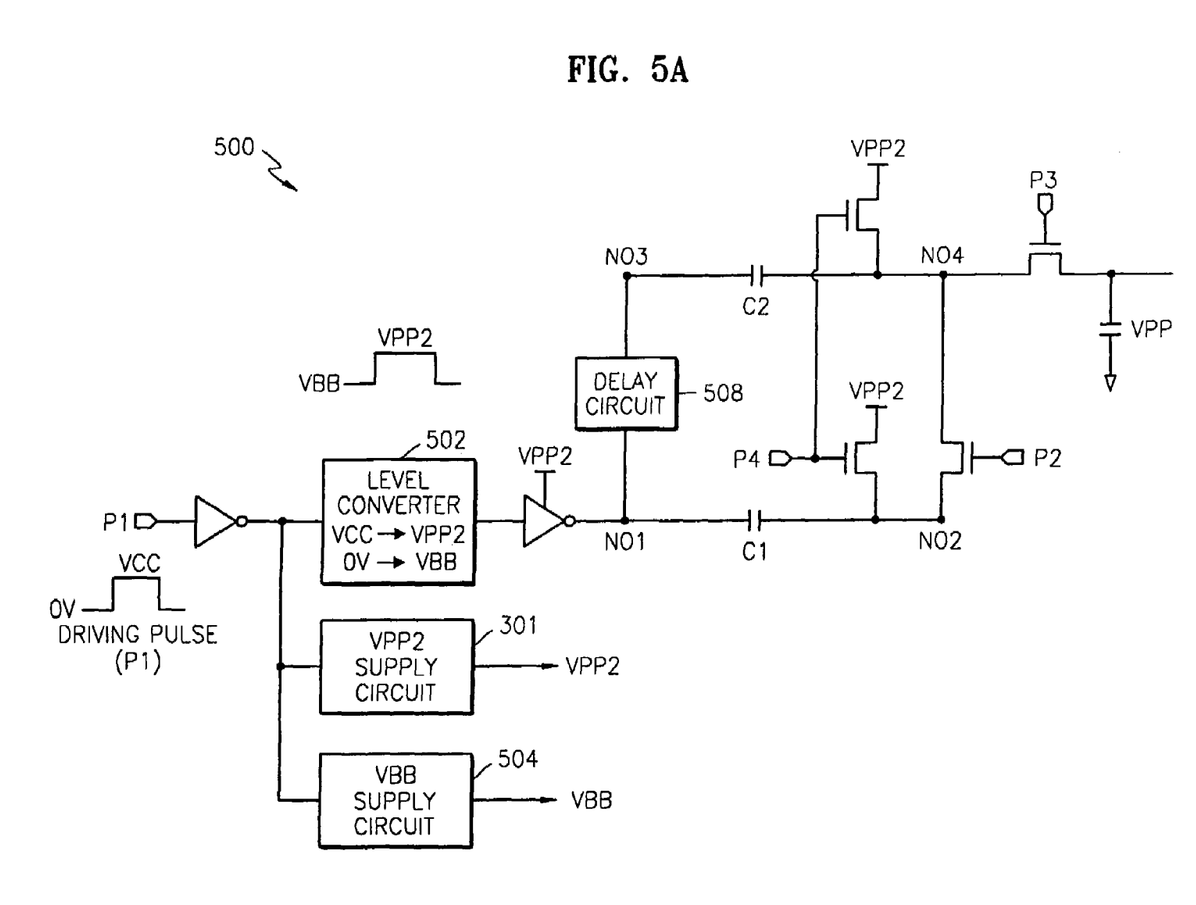
FIG. 5a is a diagram of a high voltage generation circuit according to still another preferred embodiment of the present invention.

FIG. 5*a* is a diagram of a high voltage generation circuit according to still another preferred embodiment of the present invention.

The high voltage generation circuit 500 shown in FIG. 5*a* is characterized, by way of comparison to FIG. 3*a*, in that it further comprises a level converter 502, which converts the power source voltage level (VCC) to a pre-charge voltage VPP2, and the ground voltage level (0V) to a negative voltage (VBB) lower than the ground voltage. In addition, the high voltage generation circuit 500 further comprises a low voltage (VBB) generation circuit 504 which provides an electrical charge resulting from a low voltage signal equal to or less than 0V whenever the high voltage generation circuit 500 operates.

Through the level converter 502, high voltage generation circuit 500 uses VBB, which is lower than 0V, as a low voltage source of a driver driving pumping capacitors C1 and C2, and uses pre-charge voltage VPP2 as a high voltage source such that the dynamic range of the driving voltage is increased. Also in high voltage generation circuit 500, the second node (NO2) and fourth node (NO4) are designed to be pre-charged by the pre-charge voltage (VPP2) from the VPP2 supply circuit 301.

In FIG. 5*a*, the VPP2 supply circuit 301 and the VBB supply circuit 504 are needed to continuously provide VPP2 and VBB to be used in the high voltage generation circuit 500.

Figure 5B:
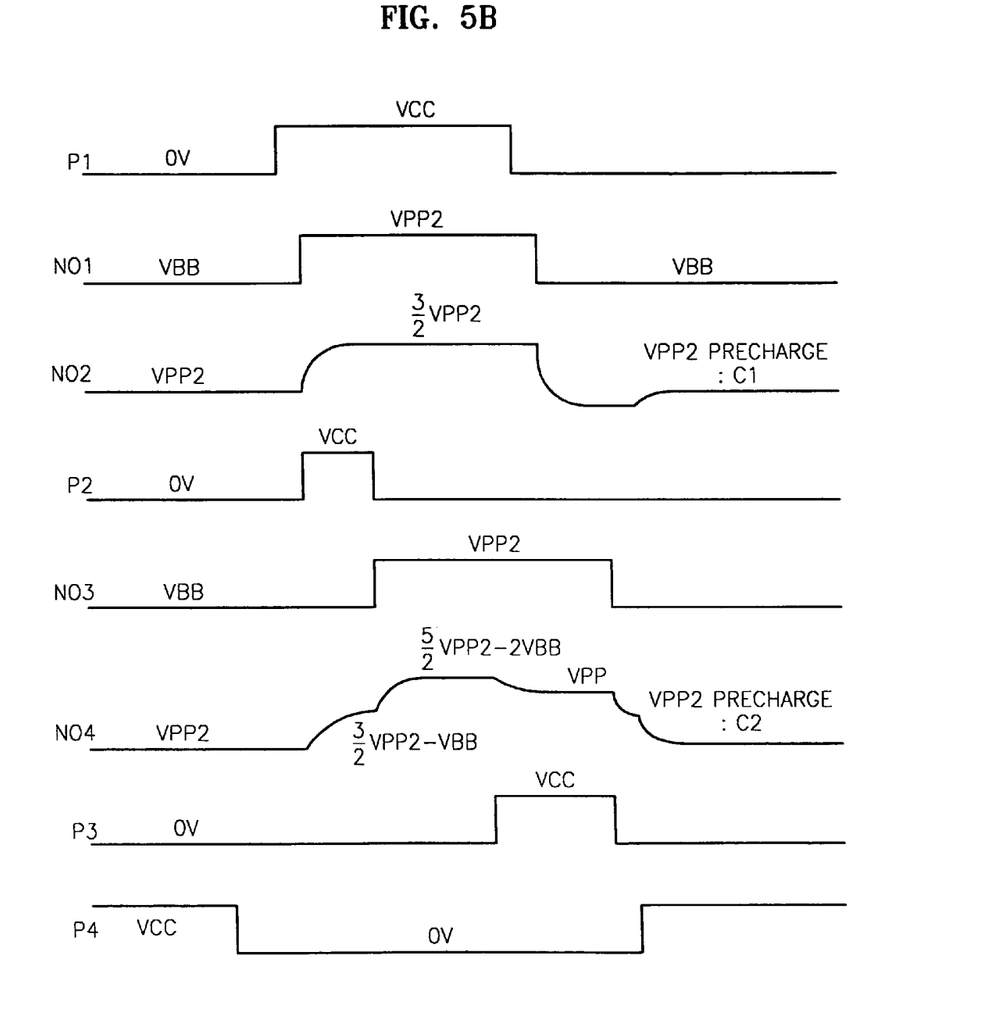

FIG. 5*b* is a timing diagram illustrating the operation of the high voltage generation circuit shown in FIG. 5*a*.

Referring to FIGS. 5*a* and 5*b*, when the fourth pulse (P4) first goes high, C1 and C2 are pre-charged with the pre-charge voltage (VPP2) provided by VPP2 supply circuit 301 so that voltage levels at second node (NO2) and fourth node (NO4) rise to VCC. When the fourth pulse (P4) goes low, the pre-charging operation stops.

If the first pulse (P1) goes low, the first node (NO1) and third node (NO3) are driven to VBB. If the first pulse (P1) and second pulse (P2) go high, the first node (NO1) is driven VPP2. The second node (NO2) is connected to fourth node (NO4) and the voltage at both the second and fourth nodes becomes 1.5 VPP2-VBB.

When the first pulse (P1) is subsequently transferred through delay circuit 208 to the third node (NO3), the second pulse (P2) goes low. At this time, the second node (NO2) and fourth node (NO4) are disconnected and third node (NO3) is driven from VBB to VPP2. Accordingly, fourth node (NO4) becomes 2.5 VPP2-2 VBB. If the third pulse (P3) goes high, the fourth node (NO4) becomes VPP under the influence of an external capacitor and this voltage is provided through transmission circuit 210 to an external load or signal line.

If the first pulse (P1) goes low, the voltage at first node (NO1) also becomes 0V and the voltage at second through fourth nodes is also lowered by VCC. Then, finally, the fourth pulse (P4) goes high, such that C1 and C2 are pre-charged with the pre-charge voltage VPP2.

The high voltage output (VPP) generated at this time is a high efficiency voltage improved by {2.5 (VPP2-VCC) -2VBB} over the high voltage generated in the high voltage generation circuit 200 of FIG. 2. Accordingly, with a shorter pumping time, the high voltage output (VPP) can be generated from a reduced power source voltage (VCC) supplied by a host system.

Several presently embodiments have been explained above with reference to the accompanying drawings. However, the present invention is not limited to the preferred embodiment described above, and those of ordinary skill in the art will understand that variations and modifications to the foregoing fall within the scope of the present invention as particularly defined by the following claims.

The high voltage generation circuit according to the present invention does not need multiple pumping operations to produce a desired high voltage output. Thus, the desired high voltage output is more quickly developed. In addition, pumping capacitors C1 and C2 are pre-charged not with the power source voltage (VCC), but with a pre-charge voltage VPP2, which is higher than the power source voltage such that the amount of charge that can be stored in the pumping capacitors increases. Thus, the generated high voltage (VPP) can be increased and the efficiency of the high voltage generator increases.

Further, when the second pumping capacitor (C2) is pre-charged, even though the voltage at third node (NO3) becomes 0V, the voltage at fourth node (NO4) becomes VPP2, and therefore the amount of wasted electrical charge is reduced.

Also, by using the VBB and VPP2 voltage levels to drive pumping capacitors, the amount of electrical charge stored in the capacitors increases such that the high voltage output (VPP) finally generated is increased and can be generated efficiently.

Meanwhile, by forming the VPP2 supply circuit separately from the high voltage generation circuit, the time required to pump a high voltage generation circuit with pre-charge voltage VPP2, to pump again with VPP voltage, and to pre-charge this again can be reduced and the amount of wasted current can be reduced. In addition, by forming the VPP2 supply circuit and VBB generation circuit separately from the high voltage generation circuit, VPP2 current and VBB current that are needed whenever the high voltage generation circuit 300 performs a pumping operation can be stably provided.

What is claimed is:

1. A high voltage generation circuit generating a high voltage output (VPP), comprising:
   a first node receiving an driving signal defined by a power source voltage (VCC);
   a first boosting unit connected between the first node and a second node, wherein the first boosting unit changes the electrical potential of the first node in response to the driving signal, and pre-charges the second node with a pre-charge voltage (VPP2) in response to a pre-charge signal;
   a second boosting unit connected between a third node and a fourth node, wherein the second boosting unit changes the electrical potential of the third node in response to the driving signal, and pre-charges the fourth node with the pre-charge voltage (VPP2) in response to the pre-charge signal;

a delay circuit connected between first and third nodes and delaying an output from the first boosting unit to the second boosting unit;

a pre-charge circuit pre-charging the second and fourth nodes with the pre-charge voltage (VPP2) in response to the pre-charge signal;

a first switch response to a transfer signal connecting the second and fourth nodes; and a second switch response to a transmission signal outputting the high voltage output (VPP) from the fourth node.

2. The high voltage generation circuit of claim 1, wherein the pre-charge voltage (VPP2) is separately generated from and higher in voltage than the power source voltage (VCC).

3. The high voltage generation circuit of claim 1, wherein the first boosting unit comprises a first pumping capacitor, and the second boosting units comprises a second pumping capacitor.

4. The high voltage generation circuit of claim 1, wherein the power source voltage (VCC) is externally provided to the high voltage generation circuit.

5. The high voltage generation circuit of claim 1, wherein the first and second switches comprise metal-oxide semiconductor (MOS) transistors.

6. A high voltage generation circuit generating a high voltage output (VPP), comprising:

a pre-charge voltage supply circuit generating a pre-charge voltage (VPP2) in response to an externally provided power source voltage (VCC);

a first node receiving the pre-charge voltage (VPP2);

a first pumping capacitor connected between the first node and a second node, wherein the first pumping capacitor changes the electrical potential of the first node and pre-charges the second node in response to the pre-charge voltage (VPP2);

a second pumping capacitor connected between a third node and a fourth node, wherein the second pumping capacitor changes the electrical potential of the third node and pre-charges the fourth node in response to the pre-charge voltage (VPP2);

a delay circuit connected between first and third nodes and delaying an output from the first pumping capacitor to the second pumping capacitor;

a pre-charge circuit pre-charging the second and fourth nodes with the pre-charge voltage (VPP2) in response to a pre-charge signal;

a first switch response to a transfer signal connecting the second and fourth nodes; and a second switch response to a transmission signal outputting the high voltage output from the fourth node.

7. The high voltage generation circuit of claim 6, wherein the pre-charge voltage (VPP2) is higher in voltage than the power source voltage (VCC).

8. The high voltage generation circuit of claim 6, wherein the power source voltage (VCC) is externally provided to the high voltage generation circuit.

9. The high voltage generation circuit of claim 6, wherein the first and second switches comprise metal-oxide semiconductor (MOS) transistors.

10. The voltage generation circuit of claim 7, further comprising:

a voltage level converter receiving the power source voltage (VCC) and generating the pre-charge voltage (VPP2) applied to the first node.

11. A high voltage generation circuit generating a high voltage output (VPP), comprising:

a level converter receiving a power source voltage varying between a VCC voltage level and a ground voltage level, and generating a driving signal having an upper voltage level of VPP2, where VPP2 is higher than VCC, and a lower voltage level of VBB, where VBB is lower than ground voltage;

a first node receiving the drive signal;

a first boosting unit connecting the first node and a second node, wherein the first boosting unit drives the electrical potential of the first node between VPP2 and VBB in response to driving signal, and pre-charging the second node to VPP2;

a second boosting unit connected between a third node and a fourth node, wherein the second boosting unit drives the electric potential of the third node in response to the driving signal, and pre-charges the fourth node to VPP2;

a delay circuit connected between first and third nodes and delaying an the output from the first boosting unit as applied to the second boosting unit;

a pre-charge circuit pre-charging the second and fourth nodes to VPP2;

a first switch, response to a transfer signal, connecting the second and fourth nodes; and a second switch, response to a transmission signal, outputting the high voltage output from the fourth node.

12. The high voltage generation circuit of claim 11, wherein the pre-charge voltage (VPP2) is separately generated from and higher in voltage than the power source voltage (VCC).

13. The high voltage generation circuit of claim 11, wherein the first boosting unit comprises a first pumping capacitor, and the second boosting units comprises a second pumping capacitor.

14. The high voltage generation circuit of claim 11, wherein the power source voltage (VCC) is externally provided to the high voltage generation circuit.

15. The high voltage generation circuit of claim 11, wherein the first and second switches comprise metal-oxide semiconductor (MOS) transistors.

* * * * *